(12) United States Patent
Mehta

(10) Patent No.: US 6,596,587 B1
(45) Date of Patent: Jul. 22, 2003

(54) SHALLOW JUNCTION EEPROM DEVICE AND PROCESS FOR FABRICATING THE DEVICE

(75) Inventor: Sunil D. Mehta, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 10/162,337

(22) Filed: Jun. 3, 2002

(51) Int. Cl.⁷ ............................................. H01L 21/336
(52) U.S. Cl. ...................... 438/257; 438/261; 438/262; 438/266; 438/786; 257/314; 257/318; 257/321
(58) Field of Search ................................. 438/257, 261, 438/262, 266, 786; 257/314, 318, 321

(56) References Cited

U.S. PATENT DOCUMENTS

| | | | |
|---|---|---|---|
| 5,132,239 A | * | 7/1992 | Ghezzi et al. ............... 438/264 |
| 5,672,521 A | | 9/1997 | Barsan et al. ............... 438/276 |
| 5,942,780 A | | 8/1999 | Barsan et al. ............... 257/321 |
| 6,255,169 B1 | * | 7/2001 | Li et al. ...................... 438/264 |

* cited by examiner

Primary Examiner—Amir Zarabian
Assistant Examiner—Jeff Vockrodt
(74) Attorney, Agent, or Firm—Brinks Hofer Gilson & Lione

(57) ABSTRACT

A shallow junction EEPROM device and process for fabricating the device includes the formation of a control-gate region and a tunnel region in a semiconductor substrate in which the control-gate region has a substantially higher total doping concentration than the tunnel region. To compensate for rate enhanced oxidation of the silicon surface overlying the control-gate region, nitrogen is selectively introduced into the control-gate region, such that the resulting dielectric layer thickness overlying the control-gate region is substantially the same as that overlying the tunnel region. The relatively high doping concentration of the control-gate region enables fabrication of an EEPROM device having high capacitance coupling, shallow junctions, and a relatively small capacitor area.

26 Claims, 4 Drawing Sheets

SHALLOW JUNCTION EEPROM DEVICE AND PROCESS FOR FABRICATING THE DEVICE

TECHNICAL FIELD

The present invention relates, in general, to electrically-erasable-programmable-read-only-memory (EEPROM) devices and, more particularly, to EEPROM devices and methods for fabricating EEPROM devices having shallow junctions, while maintaining high capacitive coupling.

BACKGROUND

Non-volatile memory devices are both electrically erasable and programmable. Such devices retain data even after the power to the device is terminated. One particular type of non-volatile memory device is the (electrically-erasable-programmable-read-only-memory) EEPROM device. In a flash EEPROM device, programming and erasing is accomplished by transferring electrons to and from a floating-gate electrode through a thin dielectric layer, known as a tunnel-oxide layer, located between the floating-gate electrode and the underlying substrate. Typically, the electron transfer is carried out either by hot electron injection, or by Fowler-Nordheim tunneling. In either electron transfer mechanism, a voltage is coupled to the floating-gate electrode by a control-gate electrode. The control-gate electrode may be formed in a region of the substrate referred to in the art as a control gate region. The control-gate electrode is capacitively coupled to the floating-gate electrode, such that a voltage applied to the control-gate electrode is coupled to the floating-gate electrode.

Single poly EEPROM cells are extensively used in programmable logic devices (PLDs). EEPROM cells used in PLDs can have a two transistor design or a three transistor design. A three transistor EEPROM cell, for example, includes a write transistor, a read transistor, and a sense transistor. In a two transistor device, the functions of read and sense transistors are combined into a single transistor. To program PLD EEPROMs, a high voltage Vpp+ is applied to the gate electrode of the write transistor and a relatively low voltage Vpp is applied to the drain (bitline contact) of the write transistor. The voltage applied to the write transistor gate electrode turns the write transistor on allowing the voltage applied to the bitline to be transferred to the source of the write transistor. Electrons on the floating-gate electrode are drawn from the floating-gate electrode to the source of the write transistor, leaving the floating-gate electrode at a high positive potential. The application of such high voltage levels is a write condition-that results in a net positive charge being stored in the EEPROM cell.

To erase the EEPROM cell, a voltage Vcc is applied to the gate of the write transistor and ground potential is applied to the bitline and a high voltage Vpp+ is applied to the control-gate. Under this bias condition, the high voltage applied to control-gate is coupled to the floating-gate electrode and the EEPROM cell is erased by the transfer of electrons from the substrate to the floating-gate electrode. The efficient application of high voltage to the write transistor and the sense transistor during program and erase cycles requires that the gate dielectric layers of these transistors have a similar thickness to the dielectric layer separating the program junction regions (which comprise a tunnel region and a control-gate region) from the overlying floating-gate electrode.

As PLD EEPROM devices are scaled to smaller dimensions, the junction depth of the program junction regions must be reduced. As used herein, the term "program junction region" refers to a highly doped junction region in the substrate underlying the tunnel region and the control-gate region. The program junction region is also known by various terms, such as the tunneling implant region. The most straightforward way to reduce the junction depth of the program junction regions is to simply reduce their doping concentrations. Reducing the doping concentration in the control-gate region, however, increases the depletion level during operation of the device. Large depletion levels, in turn, reduce the desired capacitive coupling to the floating-gate electrode.

The reduction in capacitive coupling can be compensated for by increasing the capacitor area, but this can result in a larger EEPROM memory cell. Thus, maintaining a controlled amount of depletion in the control-gate region, while avoiding increasing the capacitor area, requires that the doping level in the control-gate region be kept at a high level. A large doping concentration, however, functions to undesirably increase the thickness of the capacitor dielectric layer during thermal oxidation processes used for device fabrication. A localized variation in dielectric thickness leads to a discrepancy in dielectric thickness between the tunnel region and capacitor region, and also between the write and sense transistors and the capacitor dielectric. Accordingly, a need exists for an EEPROM device fabrication process that enables the fabrication of shallow junction devices, while maintaining uniform dielectric layer thickness, and that does not require a corresponding increase in capacitor area.

SUMMARY

The present invention provides an EEPROM device and a process for fabricating an EEPROM device having shallow junctions. The process enables the control-gate region of an EEPROM device to have a higher doping concentration than the tunnel region, while providing for a uniform dielectric layer thickness over both the tunnel region and the control-gate region. Further, the process of the invention enables the fabrication of a sufficiently highly doped control-gate region, such that a high capacitance coupling is obtained between the control-gate region and the floating-gate electrode.

In one aspect, the process of the invention includes forming a control-gate region and a tunnel region and a semiconductor substrate. The tunnel region is characterized by a first doping concentration. The doping concentration in the control-gate region is selectively increased to a concentration greater than the first doping concentration in the tunnel region. Then, nitrogen is introduced into the control-gate region and a dielectric layer is thermally formed to overlie the control-gate region and the tunnel region. In accordance with the process of the invention, the dielectric layer has substantially the same thickness over both the control-gate region and the tunnel region. A floating-gate electrode is then formed to overlie the control-gate region and the tunnel region and is separated from the control-gate region and the tunnel region by the dielectric layer.

In another aspect, the invention includes an EEPROM device having a control-gate region and a tunnel region formed in a semiconductor substrate. The tunnel region has a first doping concentration and the control-gate region has a second doping concentration that is greater than the first doping concentration. A dielectric layer of substantially the same thickness overlies both the control-gate region and the tunnel region, and a floating-gate electrode overlies the control-gate region and the tunnel region and is separated from the control-gate region and the tunnel region by the dielectric layer. The control-gate region includes sufficient nitrogen to inhibit the growth of the dielectric layer overlying the control-gate region, such that the dielectric layer has a substantially uniform thickness over both the control-gate region and the tunnel region.

Figure 1:
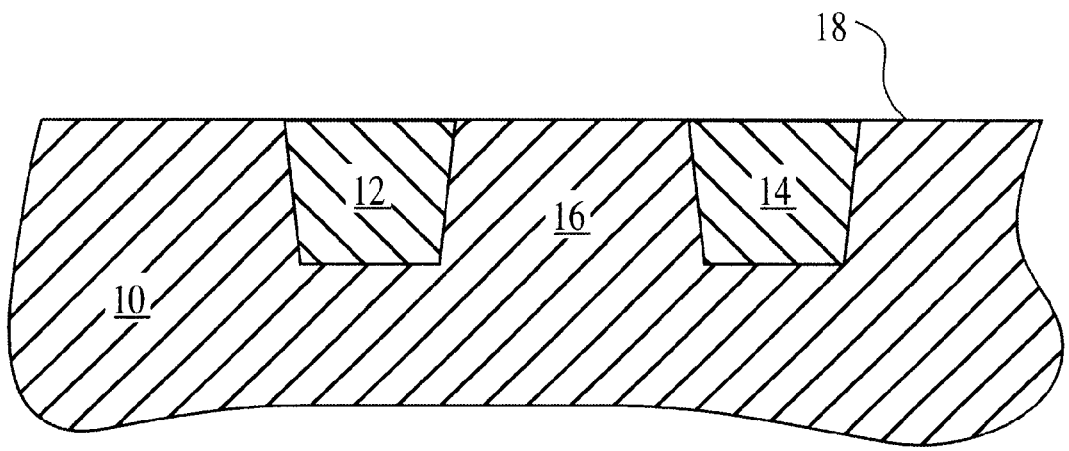
FIGS. 1–6 illustrate, in cross-section, processing steps in accordance with the invention.

It will be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION

Illustrated in FIG. 1, in cross-section is a portion of a semiconductor substrate 10 having already undergone several processing steps in accordance with the invention. In one embodiment of the invention, semiconductor substrate 10 is a P-type silicon substrate. The present invention, however, is not limited to the fabrication of an EEPROM device on a P-type substrate. Those skilled in the art will appreciate that an EEPROM device can be fabricated on other substrates, such as an N-type substrate. Additionally, substrate 10 can be an epitaxial layer, such as epitaxial silicon, silicon-on-insulator (SOI), and the like.

Semiconductor substrate 10 includes isolation regions 12 and 14. An active region 16 resides between isolations 12 and 14. Depending upon the particular conductivity of the transistors to be fabricated, active region 16 can be either an N-type or a P-type region. In the present embodiment, active region 16 is formed by introducing P-type dopants into semiconductor substrate 10.

In a preferred embodiment, isolation regions 12 and 14 are trench isolation regions fabricating by first etching recessed regions in semiconductor substrate 10, followed by filling the recessed regions with an insulating material, such as silicon oxide. Once the silicon oxide is deposited, a planarization process is carried out to form a planar surface 18 across semiconductor substrate 10. Although trench isolation regions are illustrated, those skilled in the art will recognize that other isolation techniques can be used, such as localized-oxidation-of-silicon (LOCOS), and the like, can also be used.

Once isolation regions and active regions are formed in substrate 10, a lithographic mask 20 is formed to overlie active region 16. Lithographic mask 20 can be any of a number of different types of lithographic mask, including a photoresist mask, a deep-UW mask, an X-ray mask, and the like.

Figure 2:
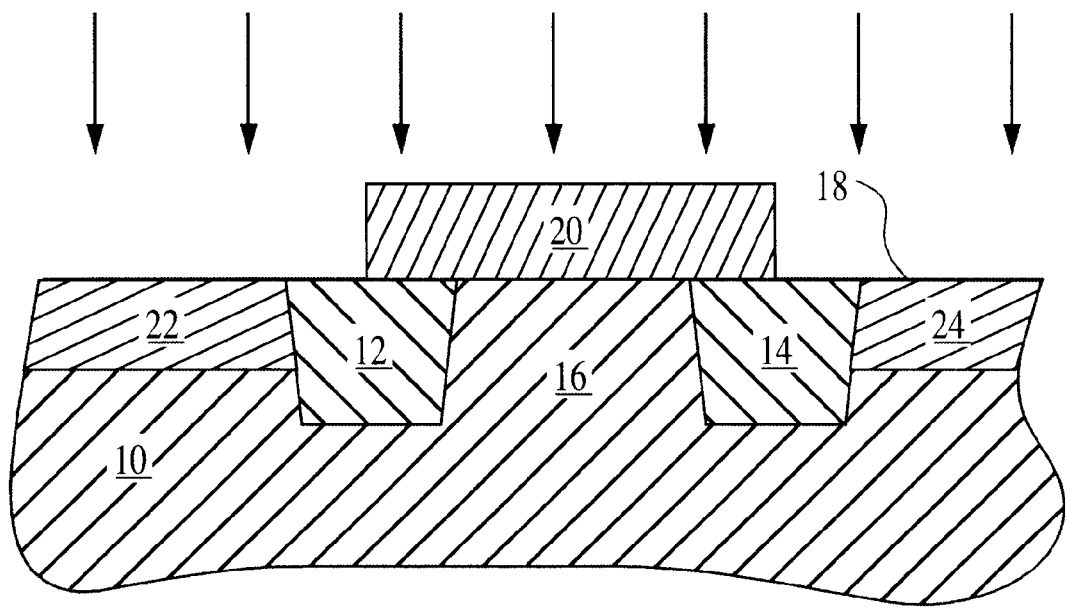

As illustrated in FIG. 2, after forming lithographic mask 20 a doping process is carried out to form a control-gate region 22 (also known as a coupling capacitor region) and a tunnel region 24 in semiconductor substrate 10. Preferably, an N-type dopant, such as phosphorous or arsenic, or a combination of phosphorous and arsenic is introduced in the semiconductor substrate 10. In one embodiment, an N-type dopant is ion implanted into semiconductor substrate 10 using lithographic mask 20 as an implant mask. In a preferred embodiment, a thin dielectric layer (not shown) overlies planar surface 18 to prevent contamination of substrate 10 during the ion implantation process. Preferably, a dose of about 5E13 ions/cm$^2$ to about 5E15 ions/cm$^2$ of N-type dopant is implanted into semiconductor substrate 10.

Figure 3:
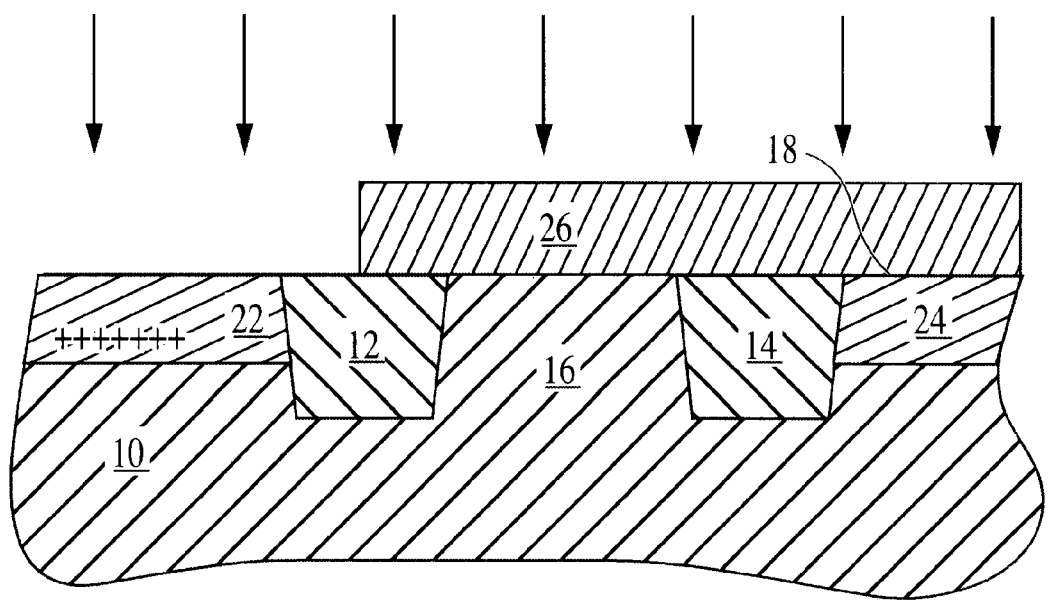

In accordance with the invention, after forming control-gate region 22 and tunnel region 24, lithographic mask 20 is removed and a control-gate mask 26 is formed to overlie planar surface 18, as illustrated in FIG. 3. Preferably, additional N-type dopant is introduced into control-gate region 22 using control-gate mask 26 as a doping mask. In a preferred embodiment, an ion implantation process is carried out to increase the N-type doping concentration of control-gate region 22, while control-gate mask 26 protects tunnel region 24. The additional doping process increases the total doping concentration in control-gate region 22. Preferably, upon completion of the control-gate doping process, control-gate region 22 has a total N-type dopant concentration of about 1E17 atoms/cm3 to about 5E19 atoms/cm3. The large N-type doping concentration created in control-gate region 22 is depicted by the "+" symbol shown in FIG. 3 and is intended to indicate that the total doping concentration in control-gate region 22 is greater than the total doping concentration in tunnel region 24.

Figure 4:
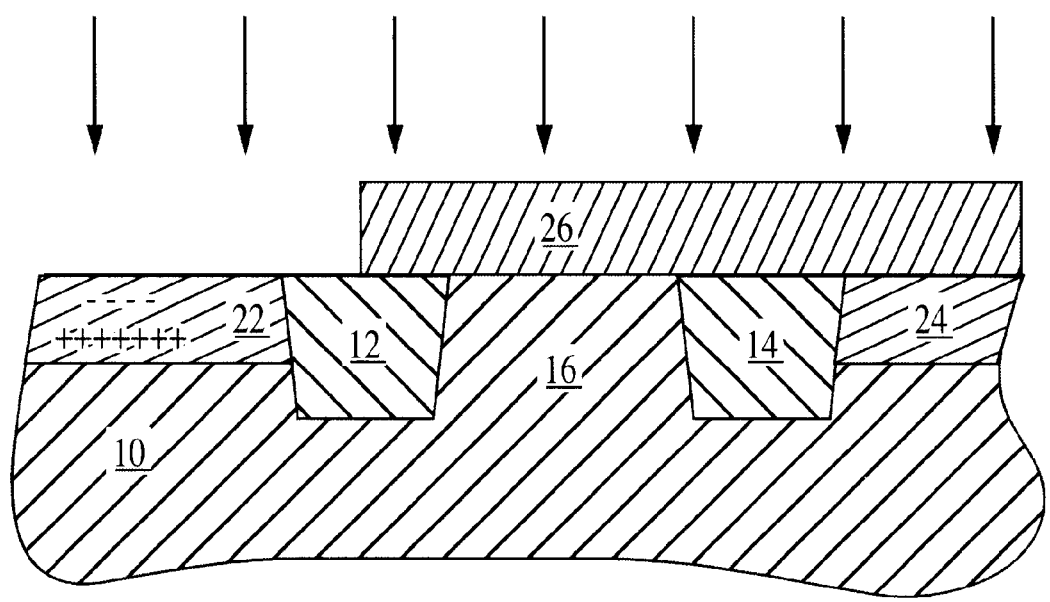

The inventive process continues, as illustrated in FIG. 4, with the introduction of nitrogen into control-gate region 22 using control-gate mask 26 to prevent the introduction of nitrogen into other regions of semiconductor substrate 10. Preferably, nitrogen is ion implanted into control-gate region 22 using an implant dose of about 5E13 ions/cm2 to about 1E15 ions/cm2 to create a nitrogen-rich region in control-gate region 22. The nitrogen atoms in control-gate region 22 are illustrated by the "−" symbols shown in FIG. 4.

Figure 5:
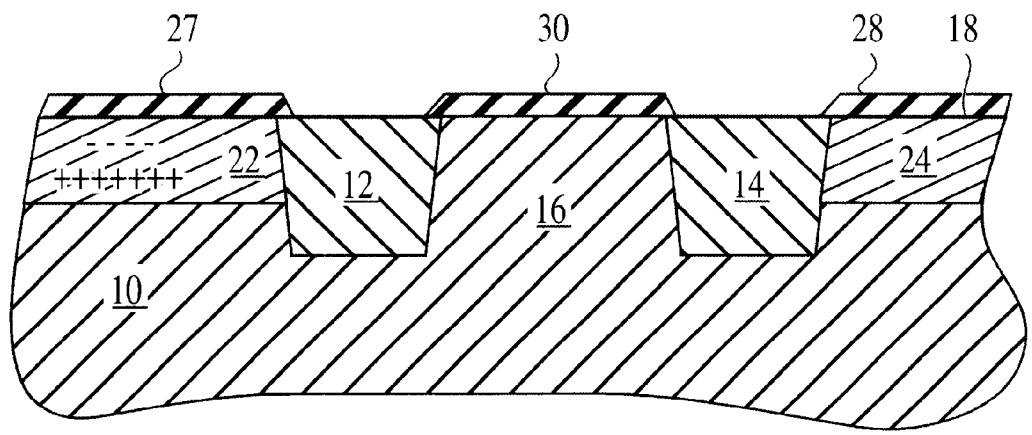

Upon completion of the nitrogen-introduction step, control-gate mask 26 is removed and dielectric layers are formed on planar surface 18, as illustrated in FIG. 5. Those skilled in the art will recognize that several processing alternatives are available for the formation of dielectric layers in semiconductor device fabrication. In a preferred embodiment, a capacitor dielectric layer 27, a tunnel dielectric layer 28 and a gate dielectric layer 30 are formed on planar surface 18 using a thermal oxidation process. Those skilled in the art will further recognize that the oxidation rate of planar surface 18 in a thermal oxidation process is governed, in part, by the doping concentration level in the various dope regions of semiconductor substrate 10. Given that the total doping concentration of control-gate region 22 is greater than the doping concentration of tunnel region 24, the doping-induced rate acceleration should produce a thicker oxide over control-gate region 22 than tunnel region 24. In the particular fabrication sequence of the present invention, however, the compensating effect of the nitrogen reduces the rate acceleration effect during the oxidation of planar surface 18 over control-gate region 22. In accordance with the invention, although the total doping concentration in control-gate region 22 is greater than the total doping concentration in tunnel region 24 (as depicted by the "+" symbols appearing in control-gate region 22) the thickness of capacitor dielectric 27 and tunnel dielectric 28 is substantially the same. As will subsequently be described, the oxidation process is carried out, such that gate dielectric layer 30 has substantailly the same thickness as tunnel dielectric 28.

Figure 6:
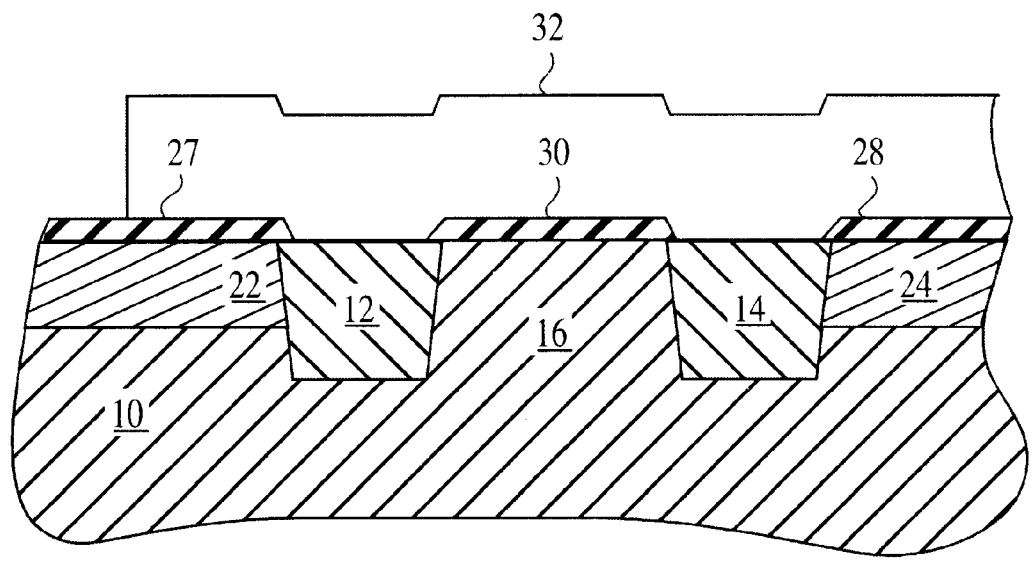

As illustrated in FIG. 6, following the dielectric layer fabrication process, a floating-gate electrode 32 is formed to overlie semiconductor substrate 10. Floating-gate electrode 32 can be formed from a number of conductive and semiconductive materials. For example, floating-gate electrode 32 can be formed by the chemical-vapor-deposition (CVD) of polycrystalline silicon, amorphous silicon, refractory-metal sulicide, and the like. In the particular embodiment illustrated in FIG. 6, floating-gate electrode 32 is formed to overlie tunnel region 24, active region 16, and a portion of control-gate region 22. Those skilled in the art will appreciate that numerous geometric combinations are possible for the fabrication of the components of an EEPROM device. Accordingly, the particular arrangement illustrated in FIG. 6 is but one of many different arrangements of the components of an EEPROM device.

Figure 7:
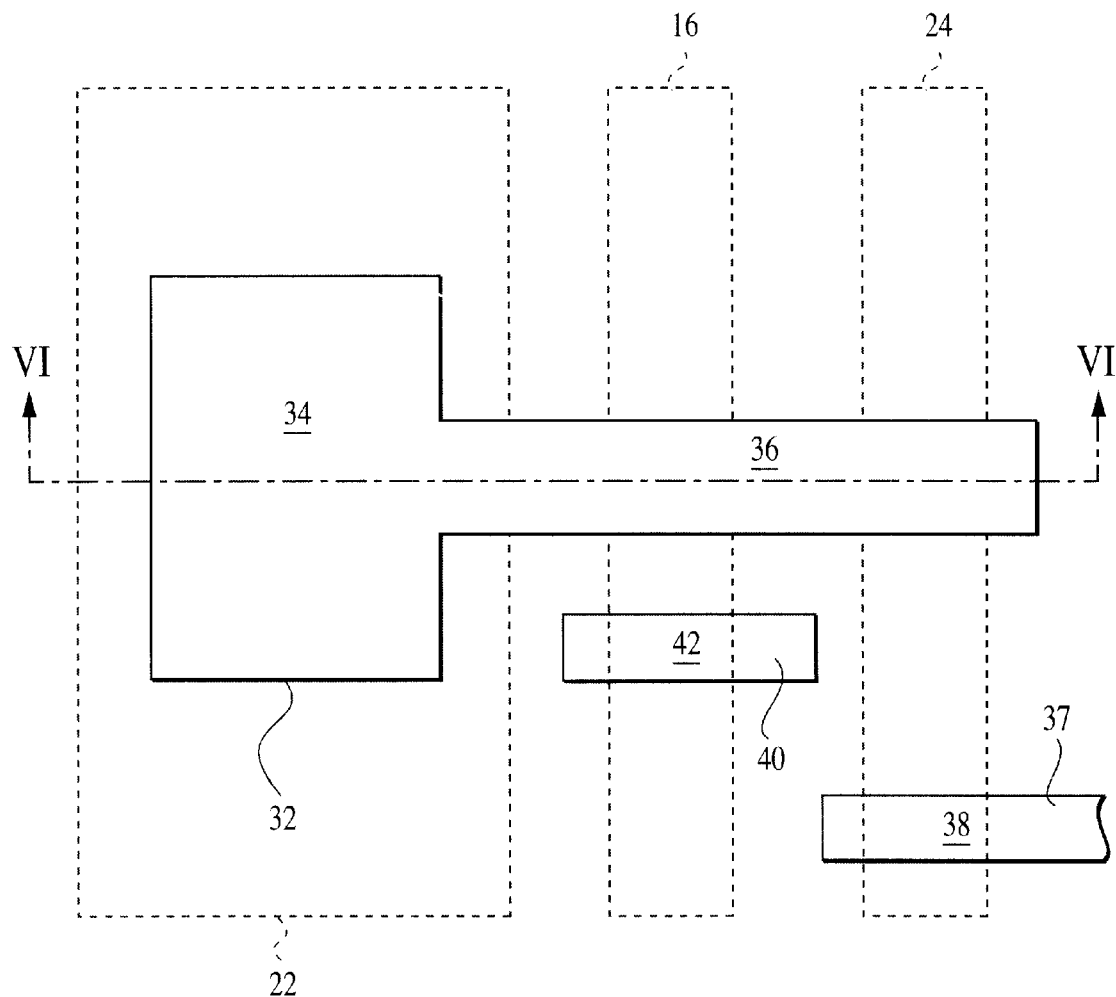
FIG. 7 illustrates a plan view of the structure illustrated in FIG. 6.

A plan view of the structure shown in FIG. 6 is illustrated in FIG. 7. As illustrated, floating-gate electrode 32 includes a capacitor portion 34 overlying control-gate region 22 and a gate portion 36 overlying active region 16 and tunnel region 24. Isolation regions 12 and 14 electrically isolate active region 16 from control-gate region 22 and from tunnel region 24. In addition to floating-gate electrode 32, a gate electrode 37 of a write transistor 38 overlies a portion of tunnel region 24. Further, a gate electrode 40 of a read transistor 42 overlies a portion of active region 16.

Those skilled in the art will recognize that numerous variations are possible for the component arrangement in an EEPROM device. Accordingly, the particular arrangement illustrated in FIG. 7 is but one of many possible arrangements for a 3-transistor EEPROM device. Further, the process of the invention can be equally advantageously employed for the fabrication of other kinds of EEPROM devices, such as 2-transistor EEPROM devices, and the like.

In the operation of an EEPROM device fabricated in accordance with the invention, floating-gate electrode 32 is capacitively coupled to control-gate region 22 in order to induce the transfer of electrical charge across tunnel dielectric layer 28. By increasing the total doping concentration of control-gate region 22, the capacitive coupling is advantageously high, enabling the overall size of the capacitor portion 34 of floating-gate electrode 32 to be relatively small. Preferably the control-gate region has a junction depth of about 0.1 to about 0.4 microns.

As illustrated in the exemplary embodiment of FIG. 7, capacitor portion 34 of floating-gate electrode 32 consumes a substantial amount of substrate surface area. By advantageously increasing the doping concentration of control-gate region 22, while avoiding the fabrication of an undesirably thick capacitor dielectric layer, the process of the invention yields an improved EEPROM device having relatively shallow junctions. Further, the overall variation and dielectric layer thickness of the various components in the EEPROM device is minimized. Preferably, both the capacitor dielectric and the tunnel dielectric are formed to have a substantially uniform thickness ranging from about 50 Angstroms to about 100 Angstroms. Moreover, the process of the invention forms an EEPROM device in which the floating-gate electrode is capacitively coupled to the control-gate region by a capacitance level of at least about 2 to about 8 femtofarads.

Thus, it is apparent that there has been described, in accordance with the invention, a process for fabricating an shallow junction EEPROM device that fully provides the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, a wide variety of fabrication techniques, such as electron-cyclotron-resonance (ECR) etching processes, molecular-beam implantation processes, high-capacitance dielectric fabrication processes, and the like, can be used. Furthermore, the steps of the process can be performed in different order than illustrated above, such as first introducing the nitrogen into the control-gate region and then introducing the additional dopant. It is therefore intended to include within the invention all such variations and modifications as fall within the scope of the appended claims and equivalents thereof.

What is claimed is:

1. A process for fabricating a non-volatile memory cell in a semiconductor device comprising:

forming a control-gate region and a tunnel region in a semiconductor substrate, wherein the tunnel region is characterized by a doping concentration;

selectively doping the control-gate region with a conductivity-determining dopant, such that a doping concentration in the control-gate region is greater than the doping concentration in the tunnel region, wherein the doping in the control-gate region and the doping in the tunnel region is of the same conductivity type;

selectively introducing nitrogen atoms into the control-gate region to form a nitrogen-rich region therein; and growing a dielectric layer overlying the control-gate region and the tunnel region, wherein the nitrogen-rich region inhibits the growth of the dielectric layer overlying the control-gate region, such that the dielectric layer has a substantially uniform thickness over both the control-gate region and the tunnel region.

2. The process of claim 1, wherein selectively doping the control-gate region comprises implanting a conductivity-determining dopant into the control-gate region.

3. The process of claim 2 further comprising forming a lithographic mask overlying the semiconductor substrate, wherein the lithographic mask exposes the control-gate region and the tunnel region, while covering a high voltage transistor region, and wherein implanting the conductivity-determining dopant into the control-gate region comprises implanting using the lithographic mask as a doping mask.

4. The process of claim 3, wherein selectively introducing nitrogen atoms into the control-gate region comprises implanting nitrogen into the control-gate region using the lithographic mask as a nitrogen implant mask.

5. The process of claim 2, wherein implanting a conductivity-determining dopant comprises implanting an n-type dopant.

6. The process of claim 5, wherein implanting a conductivity-determining dopant comprises implanting a dopant selected from the group consisting of arsenic and phosphorus.

7. The process of claim 1, wherein forming a control-gate region comprises forming a control-gate region having a junction depth of about 0.1 microns to about 0.4 microns.

8. The process of claim 7, wherein forming a control-gate region comprises forming a control-gate region having a total doping concentration of at least about 1E17 atoms/cm$^3$ to about 5E19 atoms/cm$^3$.

9. The process of claim 7, wherein selectively introducing nitrogen atoms comprises introducing a nitrogen dose of about 5E13 atoms/cm$^2$ to about 1E15 atoms/cm$^2$.

10. The process of claim 1, wherein growing a dielectric layer overlying the control-gate region and the tunnel region comprises growing an oxide layer having a substantially uniform thickness of about 50 angstroms to about 100 angstroms.

11. The process of claim 1, wherein growing a dielectric layer comprises thermal oxidation of silicon.

12. The process of claim 1 further comprising forming a floating-gate electrode to overlie at least a portion of the tunnel region and the control-gate region.

13. The process of claim 12, wherein forming a floating-gate electrode comprises forming a floating-gate electrode that is capacitively coupled to the control-gate region, such that a capacitance of at least about 2 to about 8 femtofarads exists between the floating-gate electrode and the control-gate region.

14. The process of claim 1, wherein the nitrogen atoms are introduced after the control-gate region is selectively doped with the conductivity-determining dopant.

15. The process of claim 14, wherein nitrogen is introduced into the control-gate region and the tunnel region is substantially nitrogen free.

16. A process for fabricating an EEPROM device comprising:

forming a control-gate region and a tunnel region in a semiconductor substrate, wherein the tunnel region has a first doping concentration;

increasing the doping concentration in the control-gate region to a concentration greater than the first doping concentration, wherein the doping in the control-gate region and the doping in the tunnel region is of the same conductivity type;

introducing nitrogen into the control-gate region;

thermally forming a dielectric layer overlying the control-gate region and the tunnel region, wherein the dielectric layer has substantially the same thickness over both the control-gate region and the tunnel region; and forming a floating-gate electrode overlying the control-gate region and the tunnel region and separated from the control-gate region and the tunnel region by the dielectric layer.

17. The process of claim 16, wherein increasing the doping concentration in the control gate region comprises implanting conductivity-determining dopant into the control gate region.

18. The process of claim 17 further comprising forming a lithographic mask overlying the semiconductor substrate, wherein the lithographic mask exposes the control-gate region, while covering the tunnel region, and wherein implanting conductivity-determining dopant into the control gate region comprises implanting using the lithographic mask as a doping mask.

19. The process of claim 18, wherein selectively introducing nitrogen atoms into the control-gate region comprises implanting nitrogen into the control-gate region using the lithographic mask as a nitrogen implant mask.

20. A process for fabricating an EEPROM device comprising:

providing a semiconductor substrate having an active region intermediate to a control-gate region and a tunnel region, wherein the tunnel region and the control-gate region have a doping concentration;

increasing the doping concentration in the control-gate region to a concentration level greater than the tunnel regions, wherein the doping in the control-gate region and the doping in the tunnel region is of the same conductivity type;

exclusively introducing nitrogen into the control-gate region;

growing an oxide layer on the control-gate region, the active region, and the tunnel region, wherein the oxide layer has substantially the same thickness over both the control-gate region and the tunnel region; and forming a floating-gate electrode on the oxide layer.

21. The process of claim 20, wherein increasing the doping concentration in the control gate region comprises implanting conductivity-determining dopants into the control gate region.

22. The process of claim 21, further comprising forming a lithographic mask overlying the semiconductor substrate, wherein the lithographic mask exposes the control-gate region, while covering the tunnel region and the active region, and wherein implanting conductivity-determining dopants into the control-gate region comprises implanting using the lithographic mask as a doping mask.

23. An EEPROM device comprising:

a control-gate region and a tunnel region formed in a semiconductor substrate, wherein the tunnel region has a first doping concentration and the control-gate region has a second doping concentration greater than the first doping concentration, wherein the doping in the control-gate region and the doping in the tunnel region is of the same conductivity type;

a dielectric layer of substantially the same thickness over both the control-gate region and the tunnel region; and a floating-gate electrode overlying the control-gate region and the tunnel region and separated from the control-gate region and the tunnel region by the dielectric layer, wherein the control-gate region includes sufficient nitrogen to inhibit the growth of the dielectric layer overlying the control-gate region, such that the dielectric layer has a substantially uniform thickness over both the control-gate region and the tunnel region.

24. The EEPROM device of claim 23, wherein the first and second doping concentrations comprise n-type doping concentrations.

25. The EEPROM device of claim 23, wherein the dielectric layer comprises an oxide layer.

26. The EEPROM device of claim 23, wherein the control-gate region comprises growth-inhibiting nitrogen, and wherein the tunnel region is free of growth-inhibiting nitrogen.

* * * * *